US012813204B2

(12) United States Patent
Ahn et al.

(10) Patent No.: US 12,813,204 B2
(45) Date of Patent: Nov. 24, 2026

(54) SUBSTRATE TREATING APPARATUS

(71) Applicant: SEMES CO., LTD., Cheonan-si (KR)

(72) Inventors: Hee Man Ahn, Seoul (KR); Gyeong Won Song, Cheonan-si (KR); Min Hee Cho, Suwon-si (KR); Ju Mi Lee, Seoul (KR); Byung Hwi Kim, Hwaseong-si (KR); Chun Woo Park, Yongin-si (KR)

(73) Assignee: Semes Co., Ltd., Cheonan-si (KR)

( * ) Notice: Subject to any disclaimer, the term of this patent is extended or adjusted under 35 U.S.C. 154(b) by 328 days.

(21) Appl. No.: 18/539,634

(22) Filed: Dec. 14, 2023

(65) Prior Publication Data

US 2024/0222165 A1 Jul. 4, 2024

(30) Foreign Application Priority Data

Dec. 29, 2022 (KR) ........................ 10-2022-0189528

(51) Int. Cl.
*H10P 72/00* (2026.01)
*H10P 72/30* (2026.01)

(52) U.S. Cl.
CPC ...... *H10P 72/0474* (2026.01); *H10P 72/0402* (2026.01); *H10P 72/0414* (2026.01); *H10P 72/0431* (2026.01); *H10P 72/3302* (2026.01)

(58) Field of Classification Search
CPC ............. H10P 72/0431; H10P 72/0402; H10P 72/0602; H10P 72/0414
See application file for complete search history.

(56) References Cited

FOREIGN PATENT DOCUMENTS

| | | | | | |
|---|---|---|---|---|---|
| KR | 20200086629 | A | | 7/2020 | |
| KR | 10-2020-0092698 | A | | 8/2020 | |
| KR | 10-2021-0054610 | A | | 5/2021 | |
| KR | 20210054610 | A | * | 5/2021 | .......... H10P 72/0602 |
| KR | 20210054647 | A | * | 5/2021 | .......... H10P 72/0602 |
| KR | 102282147 | B1 | | 7/2021 | |
| KR | 102303593 | B1 | * | 9/2021 | .......... H10P 72/0602 |

OTHER PUBLICATIONS

Office Action for Korean Application No. 10-2022-0189528 dated Sep. 27, 2024.

* cited by examiner

*Primary Examiner* — Gregory A Wilson
(74) *Attorney, Agent, or Firm* — Harness, Dickey & Pierce, P.LC.

(57) ABSTRACT

The inventive concept provides a substrate treating apparatus which is cool a support plate having a heater faster than a conventional substrate treating apparatus. The substrate treating apparatus includes a housing providing a treating space therein; and a support unit configured to support a substrate at the treating space. The support unit includes a heater member provided at the support plate to heat the substrate and a cooling unit configured to cool the heater member. The cooling unit includes a first gas supply nozzle positioned under an edge of the heater member for supplying a cooling gas to a center direction of a bottom surface of the heater member and a second gas supply nozzle positioned under a center of the heater member for supplying the cooling gas in an edge direction of the bottom surface of the heater member.

20 Claims, 11 Drawing Sheets

SUBSTRATE TREATING APPARATUS

CROSS-REFERENCE TO RELATED APPLICATIONS

A claim for priority under 35 U.S.C. § 119 is made to Korean Patent Application No. 10-2022-0189528 filed on Dec. 29, 2022, in the Korean Intellectual Property Office, the entire contents of which are hereby incorporated by reference.

BACKGROUND

Embodiments of the inventive concept described herein relate to a substrate treating apparatus.

Various processes such as a cleaning process, a deposition process, a photolithography process, an etching process, and an ion implantation process are performed to manufacture a semiconductor element. Among these processes, the photolithography process includes a process of forming a liquid film such as a photosensitive liquid on a substrate.

After the liquid film is formed on the substrate, a baking process for heating the substrate is performed. The baking process proceeds at a very high temperature compared to room temperature, and a heater for heating the substrate is used for this purpose.

A chamber performing the baking process heats the substrate at a different temperature depending on the substrate. For example, a preceding substrate is treated at a first temperature, and a subsequent substrate taken into a baking chamber is treated at a second temperature which is lower than the first temperature. After treating the preceding substrate at the first temperature, a cooling process which cools the heater is required to treat the subsequent substrate at the second temperature which is lower than the first temperature.

In Korea Registered Patent No. 10-2282147 (published on May 14, 2021), a substrate treating apparatus having a gas supply nozzle was registered. The gas supply nozzle cools the heater by spraying a cooling gas to the heater. On the other hand, the heater may be cooled faster if an amount of the cooling gas sprayed by the gas supply nozzle is increased, but actually there is a certain limit the amount of gas supplied to the gas supply nozzle can be increased due to the structure of the substrate treating apparatus.

SUMMARY

Embodiments of the inventive concept provide a substrate treating apparatus for cooling a heater which heats a substrate, faster than a conventional one.

The technical objectives of the inventive concept are not limited to the above-mentioned ones, and the other unmentioned technical objects will become apparent to those skilled in the art from the following description.

The inventive concept provides a substrate treating apparatus. The substrate treating apparatus includes a housing providing a treating space therein; and a support unit configured to support a substrate at the treating space, and wherein the support unit includes: a support plate supporting the substrate; a heater member provided at the support plate to heat the substrate; and a cooling unit configured to cool the heater member, and wherein the cooling unit includes: a gas supply nozzle to supply a cooling gas to the heater member, and wherein a flow rate amplifier is provided at a discharge unit of the gas supply nozzle.

In an embodiment, the flow rate amplifier has a first fluid channel, an orifice fluid channel, and a second fluid channel which are continuously formed therein, and a cap having an airflow inlet hole which communicates with the orifice fluid channel at an outside, and the orifice fluid channel has a diameter smaller than a diameter of the first fluid channel and the second fluid channel.

In an embodiment, the flow rate amplifier is provided attachable/detachable to the gas supply nozzle.

In an embodiment, the gas supply nozzle supplies the cooling gas to a bottom surface of the heater member.

In an embodiment, the substrate treating apparatus further includes: a controller for controlling the cooling unit, and wherein the controller adjusts a flow rate of a cooling gas discharged from the gas supply nozzle so the heater member reaches a predetermined temperature.

The inventive concept provides a substrate treating apparatus. The substrate treating apparatus includes a housing providing a treating space therein; and a support unit configured to support a substrate at the treating space, and wherein the support unit includes: a support plate supporting the substrate; a heater member provided at the support plate to heat the substrate; and a cooling unit configured to cool the heater member, and wherein the cooling unit includes: a gas supply nozzle to supply a cooling gas to the heater member, and wherein a first fluid channel, an orifice fluid channel, and a second fluid channel are continuously provided at a discharge unit of the gas supply nozzle, while the orifice fluid channel has a diameter smaller than a diameter of the first fluid channel and the second fluid channel.

In an embodiment, an airflow inlet hole which communicates with the orifice fluid channel is further provided at the gas supply nozzle.

In an embodiment, a cap is provided attachable/detachable at the discharge unit, and the first fluid channel, the orifice fluid channel, the second fluid channel, and the airflow inlet hole is formed on the cap.

In an embodiment, the gas supply nozzle supplies the cooling gas to a bottom surface of the heater member.

In an embodiment, the substrate treating apparatus further includes: a controller for controlling the cooling unit, and wherein the controller adjusts a flow rate of a cooling gas discharged from the gas supply nozzle so the heater member reaches a predetermined temperature.

In an embodiment, a temperature sensor for measuring a temperature of the heater member is further provided at the support plate, and the temperature sensor is positioned at a region in which a cooling gas supplied from the gas supply nozzle does not directly reach.

The inventive concept provides a substrate treating apparatus. The substrate treating apparatus includes a housing providing a treating space therein; and a support unit configured to support a substrate at the treating space, and wherein the support unit includes: a support plate supporting the substrate; a heater member provided at the support plate to heat the substrate; and a cooling unit configured to cool the heater member, and wherein the cooling unit includes: a first gas supply nozzle positioned under an edge of the heater member for supplying a cooling gas to a center direction of a bottom surface of the heater member; a second gas supply nozzle positioned under a center of the heater member for supplying the cooling gas in an edge direction of the bottom surface of the heater member, and wherein a flow rate amplifier is provided at a discharge unit of the first gas supply nozzle among the first gas supply nozzle and the second gas supply nozzle.

In an embodiment, the flow rate amplifier includes a first fluid channel, an orifice fluid channel, and a second fluid channel continuously formed therein, and a cap having an airflow inlet hole which communicates with the orifice fluid channel formed at an outside, and the orifice fluid channel has a diameter smaller than a diameter of the first fluid channel and the second fluid channel.

In an embodiment, the support plate further includes a temperature sensor for measuring a temperature of the heater member, and the temperature sensor is positioned at a region in which a cooling gas supplied from the first gas supply nozzle does not directly reach.

In an embodiment, the substrate treating apparatus further includes: a controller for controlling the cooling unit, and wherein the controller adjusts a flow rate of a cooling gas discharged from the first gas supply nozzle and the second gas supply nozzle so the heater member reaches a predetermined temperature.

In an embodiment, the first gas supply nozzle supplies the cooling gas in an amount larger than the second gas supply nozzle in a process of cooling the heater member.

In an embodiment, the first gas supply nozzle discharges the cooling gas from a position lower than the heater member toward the bottom surface of the heater member in an upwardly inclined direction.

In an embodiment, the second gas supply nozzle discharges the cooling gas from a position lower than the heater member toward the bottom surface of the heater member in an upwardly inclined direction.

In an embodiment, at least two discharge units are provided at the second gas supply nozzle.

In an embodiment, the first gas supply nozzle is provided in a plurality, and is positioned along a circumferential direction of the heater member.

According to an embodiment of the inventive concept, a substrate treating apparatus may quickly cool a heater in a support plate to a predetermined temperature without an error.

The effects of the inventive concept are not limited to the above-mentioned ones, and the other unmentioned effects will become apparent to those skilled in the art from the following description.

BRIEF DESCRIPTION OF THE FIGURES

The above and other objects and features will become apparent from the following description with reference to the following figures, wherein like reference numerals refer to like parts throughout the various figures unless otherwise specified, and wherein.

DETAILED DESCRIPTION

Figure 1:
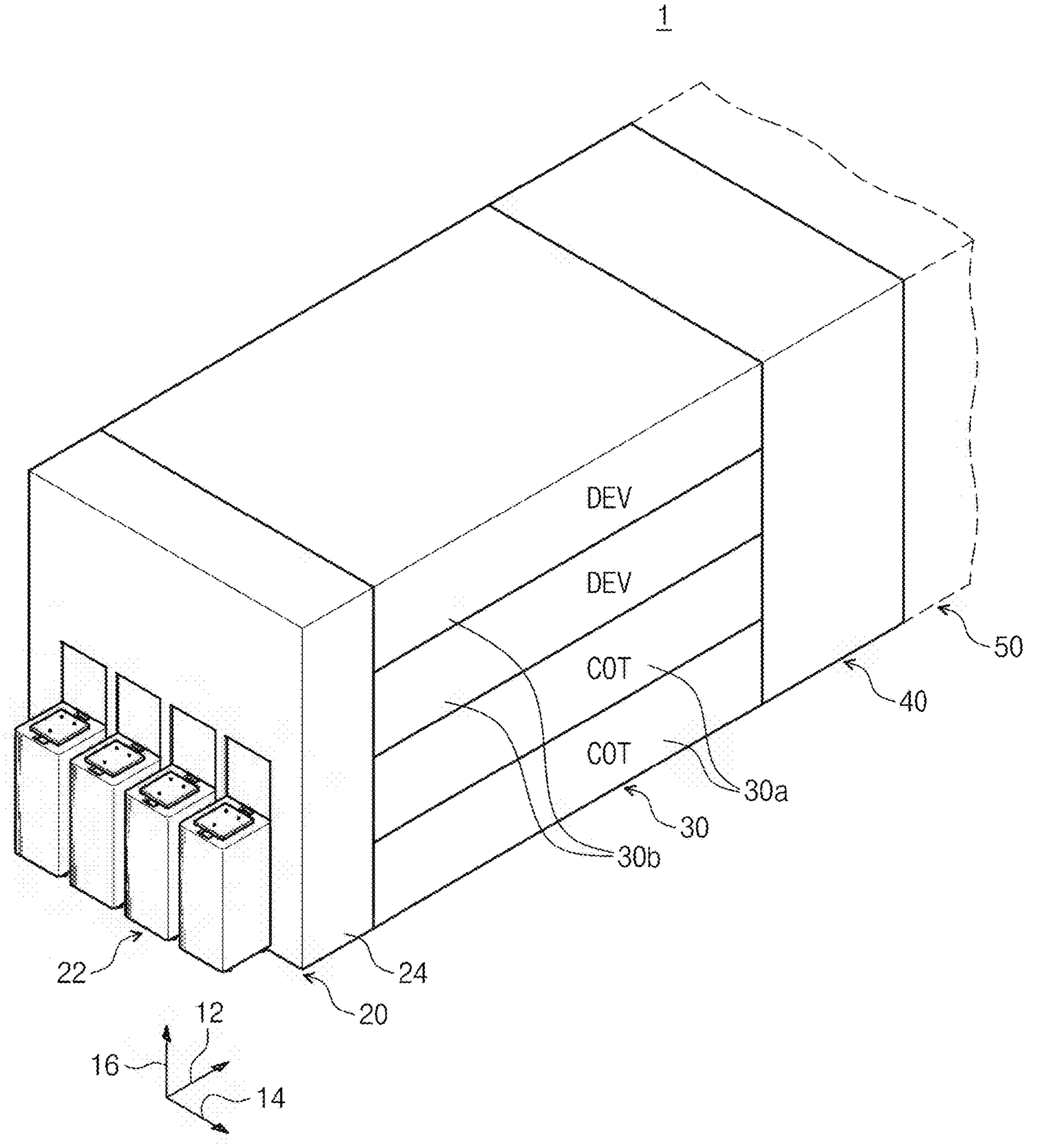
FIG. 1 is a perspective view schematically illustrating a substrate treating apparatus according to an embodiment.

Example embodiments will now be described more fully with reference to the accompanying drawings. Example embodiments are provided so that this disclosure will be thorough and will fully convey the scope to those who are skilled in the art. Numerous specific details are set forth such as examples of specific components, devices, and methods, to provide a thorough understanding of embodiments of the present disclosure. It will be apparent to those skilled in the art that specific details need not be employed, that example embodiments may be embodied in many different forms and that neither should be construed to limit the scope of the disclosure. In some example embodiments, well-known processes, well-known device structures, and well-known technologies are not described in detail.

The terminology used herein is for the purpose of describing particular example embodiments only and is not intended to be limiting. As used herein, the singular forms "a," "an," and "the" may be intended to include the plural forms as well, unless the context clearly indicates otherwise. The terms "comprises," "comprising," "including," and "having," are inclusive and therefore specify the presence of stated features, integers, steps, operations, elements, and/or components, but do not preclude the presence or addition of one or more other features, integers, steps, operations, elements, components, and/or groups thereof. The method steps, processes, and operations described herein are not to be construed as necessarily requiring their performance in the particular order discussed or illustrated, unless specifically identified as an order of performance. It is also to be understood that additional or alternative steps may be employed. When an element or layer is referred to as being "on," "engaged to," "connected to," or "coupled to" another element or layer, it may be directly on, engaged, connected or coupled to the other element or layer, or intervening elements or layers may be present. In contrast, when an element is referred to as being "directly on," "directly engaged to," "directly connected to," or "directly coupled to" another element or layer, there may be no intervening elements or layers present. Other words used to describe the relationship between elements should be interpreted in a like fashion (e.g., "between" versus "directly between," "adjacent" versus "directly adjacent," etc.). As used herein, the term "and/or" includes any and all combinations of one or more of the associated listed items.

Although the terms first, second, third, etc. may be used herein to describe various elements, components, regions, layers and/or sections, these elements, components, regions, layers and/or sections should not be limited by these terms. These terms may be only used to distinguish one element, component, region, layer or section from another region, layer or section. Terms such as "first," "second," and other numerical terms when used herein do not imply a sequence or order unless clearly indicated by the context. Thus, a first element, component, region, layer or section discussed below could be termed a second element, component, region, layer or section without departing from the teachings of the example embodiments.

Spatially relative terms, such as "inner," "outer," "beneath," "below," "lower," "above," "upper," and the like, may be used herein for ease of description to describe one element or feature's relationship to another element(s) or feature(s) as illustrated in the figures. Spatially relative terms may be intended to encompass different orientations of the device in use or operation in addition to the orientation depicted in the figures. For example, if the device in the figures is turned over, elements described as "below" or "beneath" other elements or features would then be oriented "above" the other elements or features. Thus, the example term "below" can encompass both an orientation of above and below. The device may be otherwise oriented (rotated 90 degrees or at other orientations) and the spatially relative descriptors used herein interpreted accordingly.

When the term "same" or "identical" is used in the description of example embodiments, it should be understood that some imprecisions may exist. Thus, when one element or value is referred to as being the same as another element or value, it should be understood that the element or value is the same as the other element or value within a manufacturing or operational tolerance range (e.g., ±10%).

When the terms "about" or "substantially" are used in connection with a numerical value, it should be understood that the associated numerical value includes a manufacturing or operational tolerance (e.g., ±10%) around the stated numerical value. Moreover, when the words "generally" and "substantially" are used in connection with a geometric shape, it should be understood that the precision of the geometric shape is not required but that latitude for the shape is within the scope of the disclosure.

Unless otherwise defined, all terms (including technical and scientific terms) used herein have the same meaning as commonly understood by one of ordinary skill in the art to which example embodiments belong. It will be further understood that terms, including those defined in commonly used dictionaries, should be interpreted as having a meaning that is consistent with their meaning in the context of the relevant art and will not be interpreted in an idealized or overly formal sense unless expressly so defined herein.

Figure 2:
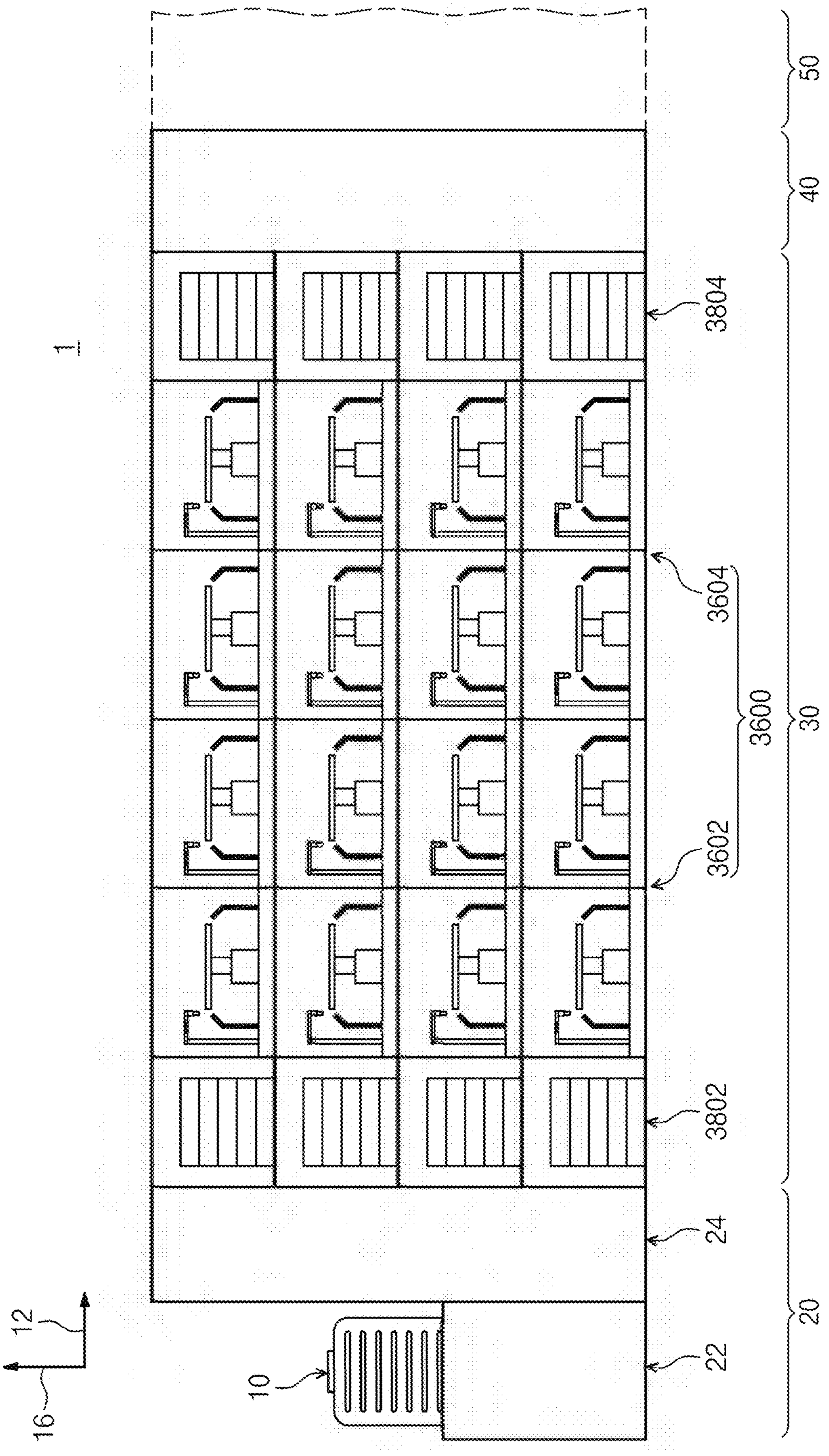
FIG. 2 is a cross-sectional view of the substrate treating apparatus illustrating a coating block or a developing block of FIG. 1.
Figure 3:
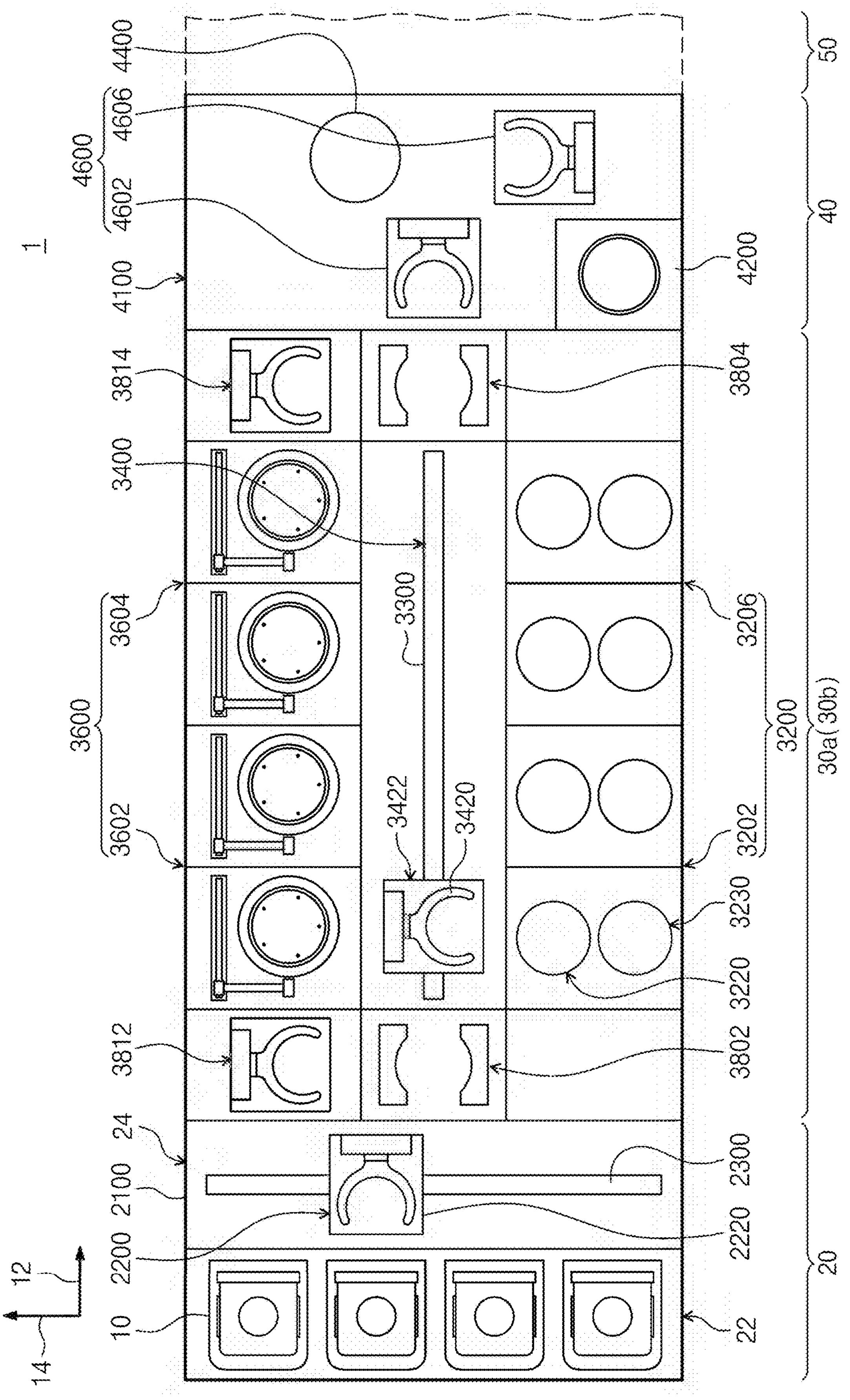
FIG. 3 is a plan view of the substrate treating apparatus of FIG. 1.

FIG. 1 is a perspective view schematically illustrating a substrate treating apparatus according to an embodiment, FIG. 2 is a cross-sectional view of the substrate treating apparatus illustrating a coating block or a developing block of FIG. 1, and FIG. 3 is a plan view of the substrate treating apparatus of FIG. 1.

Referring to FIG. 1 to FIG. 3, the substrate treating apparatus 1 includes an index module 20, a treating module 30, and an interface module 40. According to an embodiment, the index module 20, the treating module 30, and the interface module 40 are sequentially arranged in a line. Hereinafter, a direction in which the index module 20, the treating module 30, and the interface module 40 are arranged is referred to as a first direction 12, a direction perpendicular to the first direction 12 is referred to as a second direction 14, and a direction perpendicular to both the first direction 12 and the second direction 14 is referred to as a third direction 16.

The index module 20 transfers a substrate W to the treating module 30 from a container 10 at which the substrate W is stored, and stores a treated substrate W in the container 10. A lengthwise direction of the index module 20 is provided in the second direction 14. The index module 20 has a load port 22 and an index frame 24. The load port 22 is positioned on an opposite side of the treating module 30 with respect to the index frame 24. The container 10 in which the substrates W are stored is positioned in the load port 22. A plurality of load ports 22 may be provided, and the plurality of load ports 22 may be disposed along the second direction 14.

As the container 10, a sealed container 10 such as a front open unified pod (FOUP) may be used. The container 10 may be positioned in the load port 22 by a transfer means (not shown) such as an overhead transfer, an overhead conveyor, or an automatic guided vehicle.

An index robot 2200 is provided within the index frame 24. A guide rail 2300 provided with its lengthwise direction in the second direction 14 within the index frame 24, and the index robot 2200 may be movable along the guide rail 2300. The index robot 2200 includes a hand 2220 on which the substrate W is positioned, and the hand 2220 may be forwardly and backwardly movable, rotatable around the third direction 16, and movable along the third direction 16.

The treating module 30 performs a coating process and a developing process on the substrate W. The treating module 30 has a coating block 30*a* and a developing block 30*b*. The coating block 30*a* performs the coating process on the substrate W, and the developing block 30*b* performs the developing process on the substrate W. A plurality of coating blocks 30*a* are provided, and they are provided stacked on each other. A plurality of developing blocks 30*b* are provided, and the developing blocks 30*b* are provided stacked on each other. According to an embodiment of FIG. 2, two coating blocks 30*a* are provided, and two developing blocks 30*b* are provided. The coating blocks 30*a* may be disposed under the developing blocks 30*b*. In some embodiments, the two coating blocks 30*a* perform the same process and may be provided in the same structure. In addition, the two developing blocks 30*b* perform the same process and may be provided in the same structure.

Figure 4:
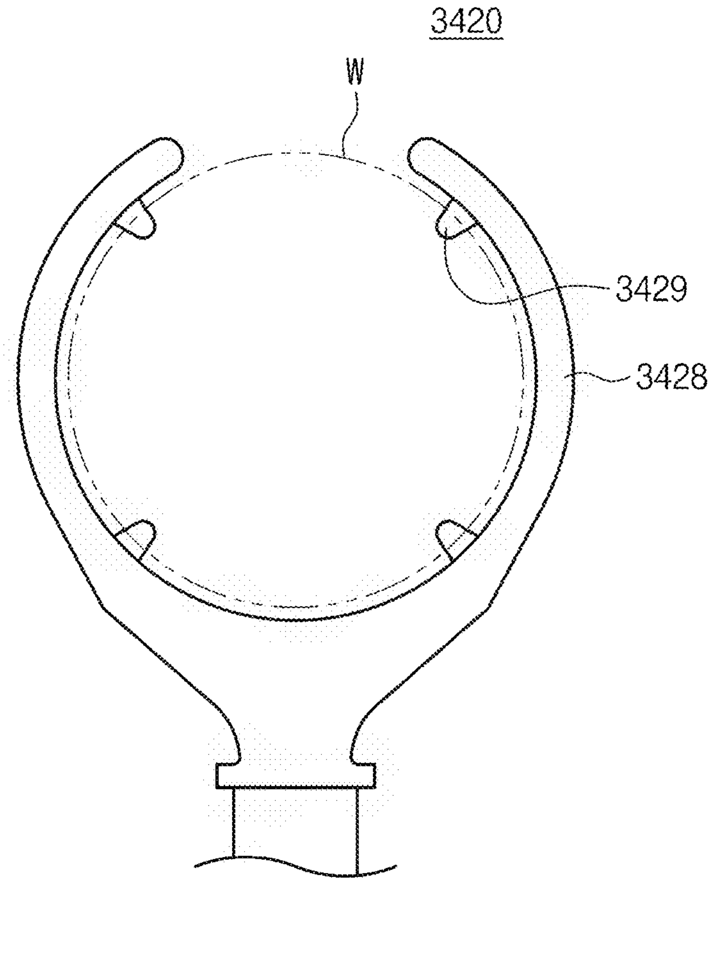
FIG. 4 is a illustrates an embodiment of a hand of a transfer robot of FIG. 3.

Referring to FIG. 4, the coating block 30*a* has a heat treating chamber 3200, a transfer chamber 3400, a liquid treating chamber 3600, and a buffer chamber 3800. The heat treating chamber 3200 performs a heat treatment process on the substrate W. The heat treatment process may include a cooling process and a heating process. The liquid treating chamber 3600 supplies a liquid onto the substrate W to form a liquid film. The liquid film may be a photoresist film or an antireflection film. The transfer chamber 3400 transfers the substrate W between the heat treating chamber 3200 and the liquid treating chamber 3600 within the coating block 30*a*.

The transfer chamber 3400 is provided with its lengthwise direction parallel to the first direction 12. A transfer robot 3422 is provided in the transfer chamber 3400. The transfer robot 3422 transfers the substrate between the heat treating chamber 3200, the liquid treating chamber 3600, and the buffer chamber 3800. In some embodiments, the transfer robot 3422 has a hand 3420 on which the substrate W is placed, and the hand 3420 can be provided to be forwardly and backwardly movable, rotatable around the third direction 16, and be movable along the third direction 16. In the transfer chamber 3400, a guide rail 3300 is provided with its lengthwise direction is provided parallel to the first direction 12, and the transfer robot 3422 can be provided to be movable along the guide rail 3300.

FIG. 4 illustrates an embodiment of a hand of a transfer robot of FIG. 3. Referring to FIG. 4, the hand 3420 has a base 3428 and a support protrusion 3429. The base 3428 may have an annular ring shape in which a portion of a circumference is cut out. The base 3428 has an inner diameter larger than a diameter of the substrate W. The support protrusion 3429 inwardly extends from the base 3428. A plurality of support protrusions 3429 are provided and support an edge region of the substrate W. According to an embodiment, four support protrusions 3429 may be provided at equal intervals.

A plurality of heat treating chambers 3200 are provided. Referring to FIG. 3 and FIG. 4, the heat treating chambers 3200 are arranged along the first direction 12. The heat treating chambers 3200 are positioned on a side of the transfer chamber 3400.

Figure 5:
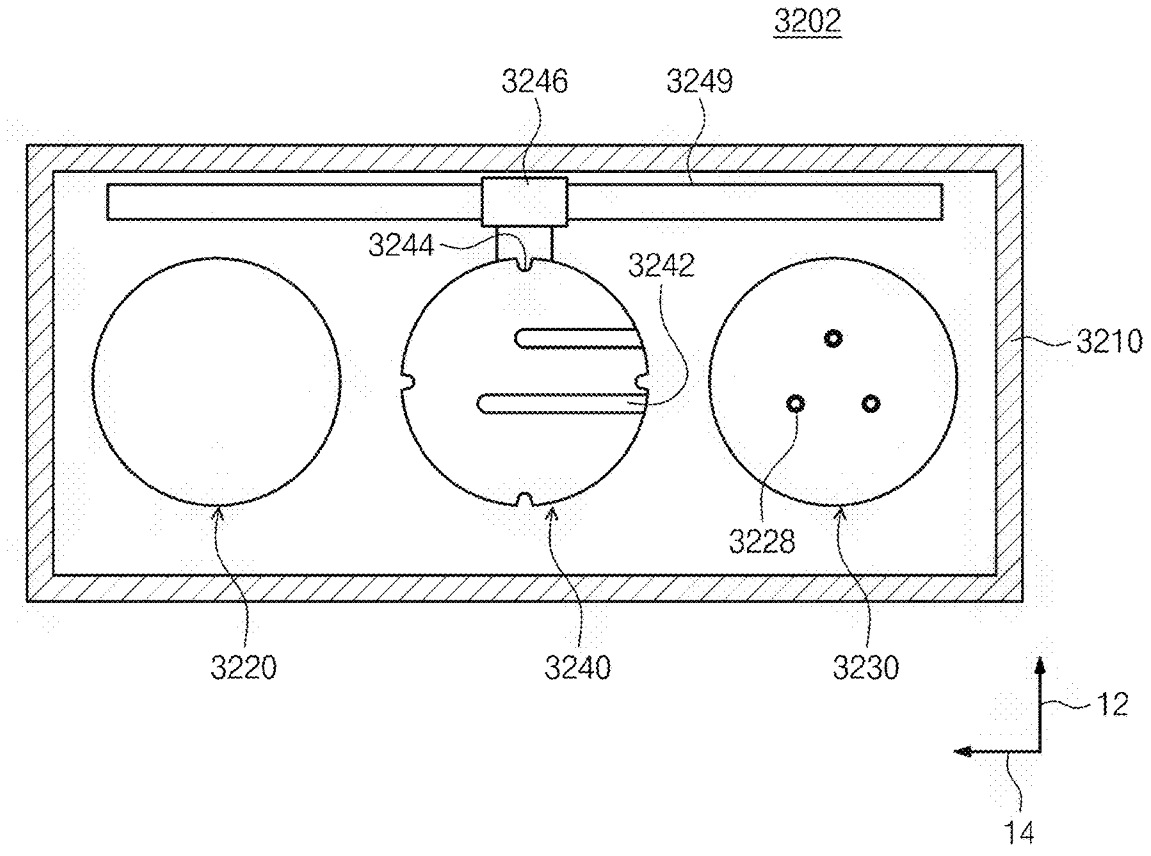
FIG. 5 is a plan view schematically illustrating an embodiment of a heat treating chamber of FIG. 3.
Figure 6:
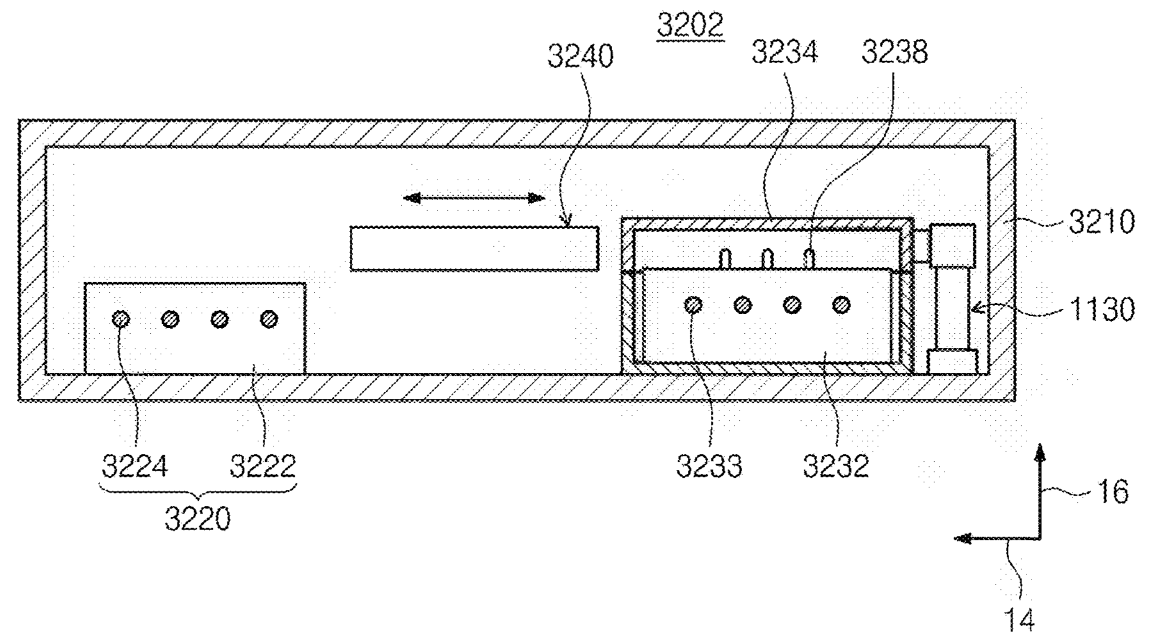
FIG. 6 is a front view of the heat treating chamber of FIG. 5.

FIG. 5 is a plan view schematically illustrating an embodiment of a heat treating chamber of FIG. 3, and FIG. 6 is a front view of the heat treating chamber of FIG. 5. The heat treating chamber 3200 has a housing 3210, a cooling apparatus 3220, a heating apparatus 3230, and a transfer plate 3240.

The housing 3210 is provided in a substantially rectangular parallelepiped shape. An inlet (not shown) through which the substrate W enters and exits is formed on a sidewall of the housing 3210. The inlet may be kept open. A door (not shown) may be provided to selectively open and close the inlet. The cooling apparatus 3220, the heating apparatus 3230, and the transfer plate 3240 are provided within the housing 3210. The cooling apparatus 3220 and the heating apparatus 3230 are provided side by side along the second direction 14. In some embodiments, the cooling apparatus 3220 may be positioned closer to the transfer chamber 3400 than the heating apparatus 3230.

The cooling apparatus 3220 has a cooling plate 3222. The cooling plate 3222 may have a substantially circular shape when viewed from above. A cooling member 3224 is provided at the cooling plate 3222. In some embodiments, the cooling member 3224 is formed within the cooling plate 3222 and may be provided as a fluid channel through which a cooling fluid flows.

The heating apparatus 3230 is provided as a heating unit 1000 which heats the substrate at a temperature higher than room temperature. The heating apparatus 3230 heats the substrate W at an atmospheric pressure or a depressurized pressure lower than the atmospheric pressure.

The transfer plate 3240 is generally provided in a disk shape and has a diameter corresponding to that of the substrate W. A notch 3244 is formed at an edge of the transfer plate 3240. The notch 3244 may have a shape corresponding to the protrusion 3429 formed in the hand 3420 of the transfer robots 3422 and 3424 described above. In addition, the notch 3244 is provided in a number corresponding to the protrusion 3429 formed in the hand 3420, and is formed in a position corresponding to the protrusion 3429. If a vertical position of the hand 3420 and the transfer plate 3240 changes at a position at which the hand 3420 and the transfer plate 3240 are aligned in a vertical direction, the substrate W is transferred between the hand 3420 and the transfer plate 3240. The transfer plate 3240 is mounted on the guide rail 3249 and can be moved between a first region 3212 and a second region 3214 along the guide rail 3249 by the driver 3246. A plurality of slit-shaped guide grooves 32242 are provided in the transfer plate 3240. The guide groove 3242 extends from an end of the transfer plate 3240 to within the transfer plate 3240. The guide groove 3242 is provided with its lengthwise direction along the second direction 14, and the guide grooves 3242 are positioned spaced apart from each other along the first direction 12. The guide groove 3242 prevents the transfer plate 3240 and the lift pin 1340 from interfering with each other when the substrate W is transferred between the transfer plate 3240 and the heating apparatus 3230.

The substrate W is heated while the substrate W is positioned directly on the support plate 1320, and the substrate W is cooled while the transfer plate 3240 on which the substrate W is placed is in contact with the cooling plate 3222. The transfer plate 3240 is made of a material having a high heat transfer rate so that a heat transfer is performed well between the cooling plate 3222 and the substrate W. The transfer plate 3240 may be made of a metal material.

A heating apparatus 3230 provided in a portion of the heat treating chambers 3200 can improve an adhesion rate of the photoresist liquid to the substrate W by supplying a gas during a substrate W heating. In some embodiments, the gas may be a hexamethyldisilane gas.

A plurality of liquid treating chambers 3600 are provided. A portion of the liquid treating chambers 3600 may be provided stacked on each other. The liquid treating chambers 3600 are disposed on a side of the transfer chamber 3402. The liquid treating chambers 3600 are arranged side by side in the first direction 12. A portion of the liquid treating chambers 3600 are provided at positions adjacent to the index module 20. Hereinafter, these liquid treating chambers are referred to as front liquid treating chambers 3602. The other portion of the liquid treating chambers 3600 is provided at a position adjacent to the interface module 40. Hereinafter, these liquid treating chambers are referred to as rear heat treating chambers 3604.

The front liquid treating chamber 3602 coats a first liquid on the substrate W, and the rear heat treating chamber 3604 coats a second liquid on the substrate W. The first liquid and the second liquid may be different types of liquid. In some embodiments, the first liquid is an antireflection film, and the second liquid is a photoresist liquid. The photoresist liquid may be coated on the substrate W to which the antireflection film is coated. Selectively, the first liquid may be a photoresist liquid, and the second liquid may be an antireflection film. In this case, the anti-reflection film may be coated on the substrate W to which the photoresist liquid is coated. Selectively, the first liquid and the second liquid are the same type of liquid, and all of them may be photoresist liquids.

Figure 7:
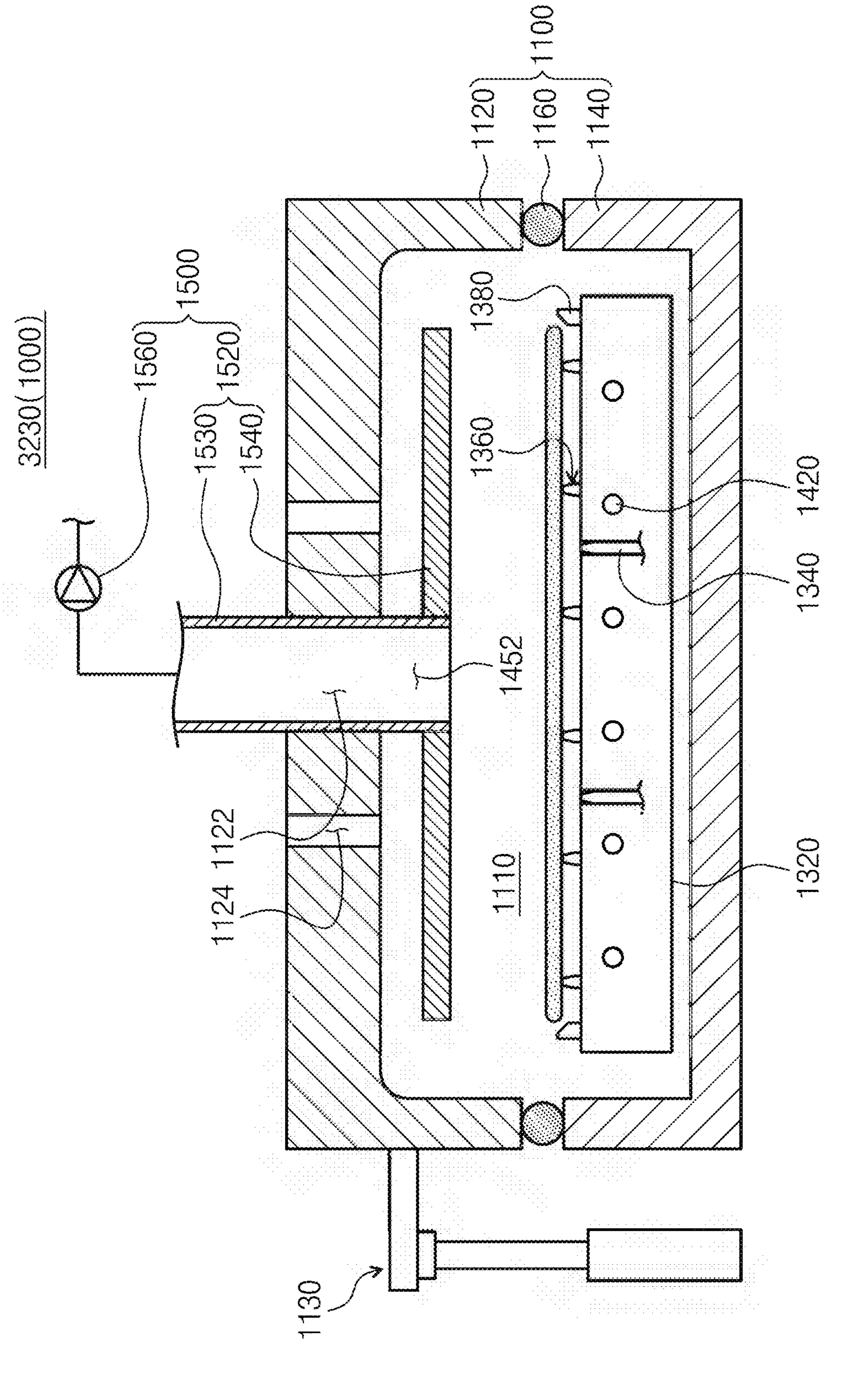
FIG. 7 is a cross-sectional view illustrating a heating apparatus of FIG. 6.

FIG. 7 is a cross-sectional view illustrating a heating apparatus of FIG. 6. Referring to FIG. 7, the heating unit 1000 includes a housing 1100, a support unit 1300, and an exhaust unit 1500.

The housing 1100 provides a treating space 1110 for heat-treating the substrate W therein. The treating space 1110 is provided as a space blocked from the outside. The housing 1100 includes a top body 1120, a bottom body 1140, and a sealing member 1160.

The top body 1120 is provided in a cylindrical shape with an open bottom part. An exhaust hole 1122 and an inlet hole 1124 are formed on a top surface of the top body 1120. The exhaust hole 1122 is formed at a center of the top body 1120. The exhaust hole 1122 exhausts an atmosphere of the treating space 1110. A plurality of inlet holes 1124 are provided to be spaced apart from each other, and are arranged to surround the exhaust holes 1122. The inlet holes 1124 introduce an outer airflow to the treating space 1110. In some embodiments, there are four inlet holes 1124 and the outer airflow may be an air.

Selectively, three or at least five inlet holes 1124 may be provided, or the outside air may be an inert gas.

The bottom body 1140 is provided in a cylindrical shape with an open top part. The bottom body 1140 is positioned below the top body 1120. The top body 1120 and the bottom body 1140 are positioned to face each other in the vertical direction. The top body 1120 and the bottom body 1140 are combined with each other to form a treating space 1110 therein. The top body 1120 and the bottom body 1140 are positioned so that central axes thereof coincide with each other in the vertical direction. The bottom body 1140 may have the same diameter as the top body 1120. That is, a top end of the bottom body 1140 may be positioned to face a bottom end of the top body 1120.

One of the top body 1120 and the bottom body 1140 is moved to an open position and a close position by the a lifting/lowering member 1130, and the other is fixed. In the embodiment, it will be described that a position of the bottom body 1140 is fixed and the top body 1120 is moved. The open position is a position at which the top body 1120 and the bottom body 1140 are spaced apart from each other to open the treating space 1110. The close position is a position at which the treating space 1110 is sealed from the outside by the bottom body 1140 and the top body 1120.

The sealing member 1160 is positioned between the top body 1120 and the bottom body 1140. The sealing member 1160 allows the treating space to be sealed from the outside when the top body 1120 and the bottom body 1140 contact each other. The sealing member 1160 may be provided in an annular ring shape. The sealing member 1160 may be fixedly coupled to the top end of the bottom body 1140.

Figure 8:
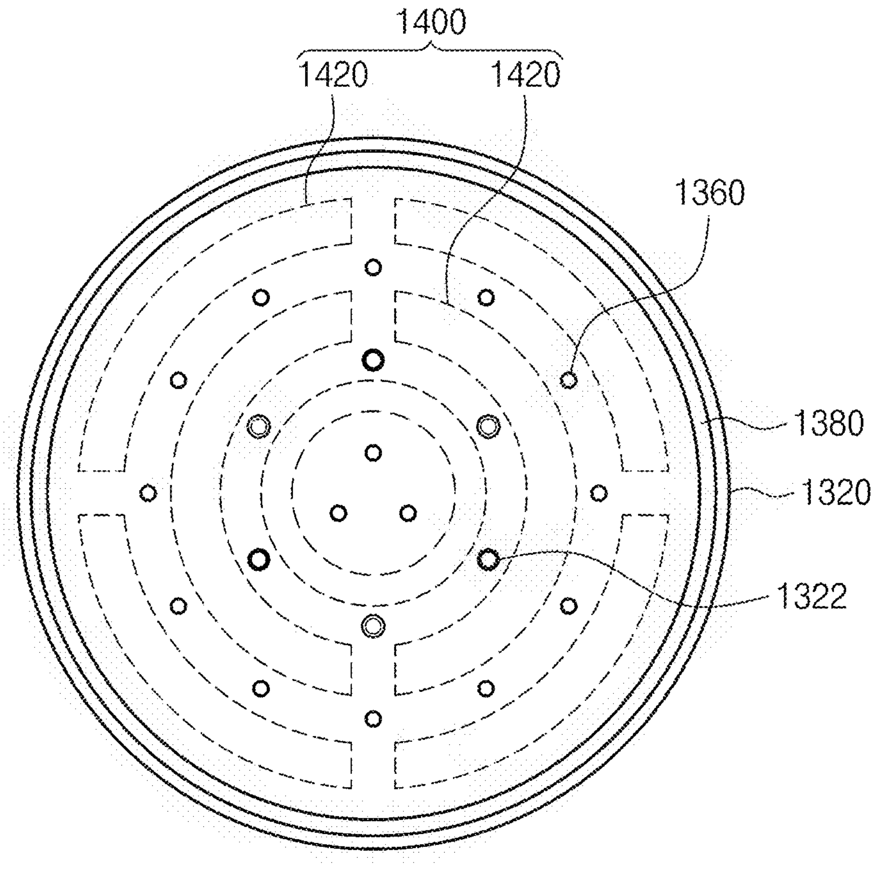
FIG. 8 to FIG. 9 are respectively a plan view and a cross-sectional view illustrating a substrate support unit of FIG. 7.
Figure 9:
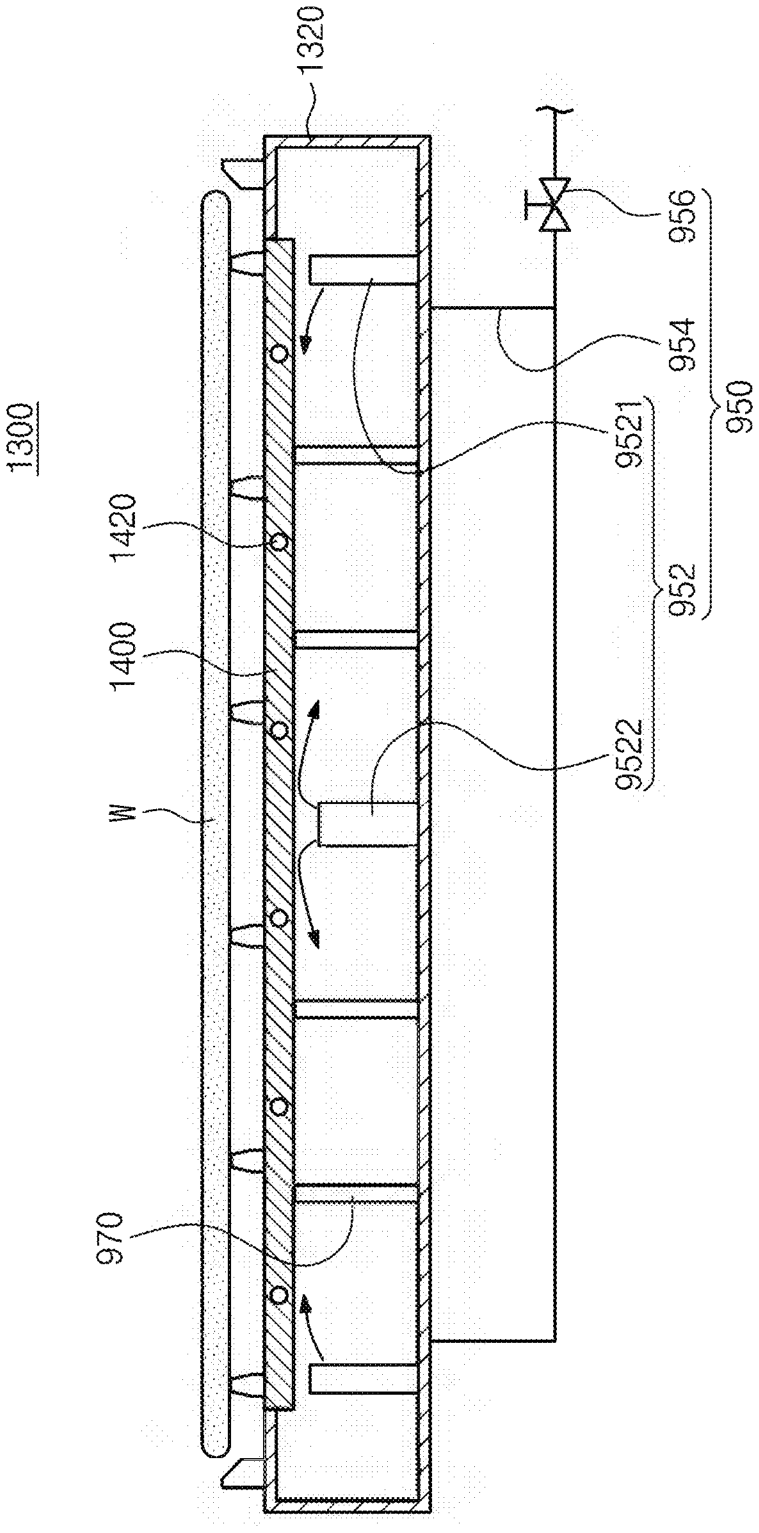

FIG. 8 to FIG. 9 are respectively a plan view and a cross-sectional view illustrating a substrate support unit of FIG. 7.

Referring to FIG. 7 to FIG. 9, the support unit 1300 supports the substrate W in the treating space 1110. The support unit 1300 includes a support plate 1320 and a cooling unit 950.

The support plate 1320 may be provided in a circular shape. A top surface of the support plate 1320 may have a diameter greater than that of the substrate W.

When viewed from above, lift holes 1322 may be arranged to surround a center of the top surface of the support plate 1320. Each of the lift holes 1322 are arranged to be spaced apart from each other along a circumferential direction of the support plate 1320.

The lift pin 1340 may lift and lower the substrate W on the support plate 1320. A plurality of lift pins 1340 may be provided. A lift pin 1340 may be positioned in each of the lift holes 1322. The driving member (not shown) moves each of the lift pins 1340. The driving member (not shown) may be a cylinder.

The support pin 1360 prevents the substrate W from directly contacting the support plate 1320. The support pin 1360 may be provided in a pin shape with its lengthwise direction parallel to the lift pin 1340. A plurality of support pins 1360 may be provided, and each of them may be fixedly installed on the support plate 1320. The support pins 1360 are positioned to upwardly protrude from the support plate 1320. A top end of the support pin 1360 may be provided as a contact surface in direct contact with a bottom surface of the substrate W, and the contact surface may have an upward convex shape.

A guide 1380 guides the substrate W so that the substrate W is positioned in a correct position. The guide 1380 has a diameter larger than that of the substrate W. An inner surface of the guide 1380 has a downwardly inclined shape toward a central axis of the support plate 1320. Accordingly, the substrate W over the inner surface of the guide 1380 is moved to a regular position along the inclined surface thereof. In addition, the guide 1380 blocks a certain amount of airflow inflowing between the substrate W and the support plate 1320.

The heater member 1400 performs a heat treatment on the substrate W positioned on the support plate 1320. The heater member 1400 may be provided in the form of a disk. The heater member 1400 includes a heater 1420. The heater 1420 is provided within the support plate 1320 and is positioned below the substrate W. The heater 1420 may be provided in a heat wire shape or a block shape. A plurality of heaters 1420 may be provided.

The exhaust unit 1500 forcibly exhausts an inside of the treating space 1110. The exhaust unit 1500 includes an exhaust pipe 1530 and a guide plate 1540. The exhaust pipe 1530 is positioned to penetrate a top wall of the top body 1120. In some embodiments, the exhaust pipe 1530 may be positioned to be inserted into the exhaust hole 1122. That is, a bottom end of the exhaust pipe 1530 is positioned within the treating space 1110, and a top end of the exhaust pipe 1530 is positioned outside the treating space 1110. A depressurizing member 1560 is connected to the top end of the exhaust pipe 1530. The depressurizing member 1560 depressurizes the exhaust pipe 1530. Accordingly, an atmosphere of the treating space 1110 is exhausted by sequentially passing through the through hole 1542 and the exhaust pipe 1530.

The guide plate 1540 has a plate shape having a through hole 1542 at a center. The guide plate 1540 has a circular plate shape extending from the bottom end of the exhaust pipe 1530. The guide plate 1540 is fixedly coupled to the exhaust pipe 1530 so that the through hole 1542 and an inside of the exhaust pipe 1530 communicate with each other. The guide plate 1540 is positioned above the support plate 1320 to face a support surface of the support plate 1320. The guide plate 1540 is positioned higher than the bottom body 1140. In some embodiments, the guide plate 1540 may be positioned at a height facing the top body 1120. When viewed from above, the guide plate 1540 is positioned to overlap the inlet hole 1124 and has a diameter spaced apart from an inner surface of the top body 1120. As a result, a gap is created between a side of the guide plate 1540 and an inner side of the top body 1120, which is provided as a fluid channel through which an airflow introduced through the inlet hole 1124 is supplied to the substrate W.

Figure 10:
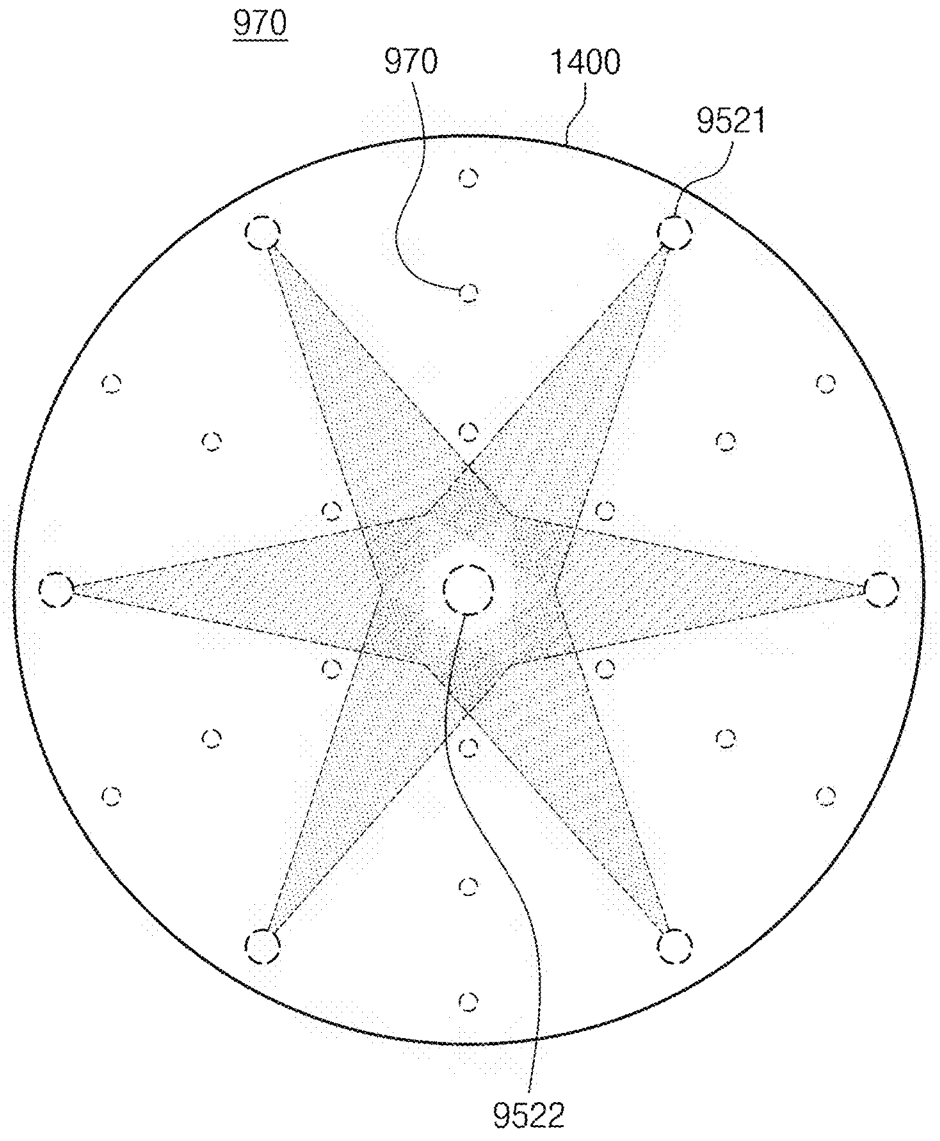
FIG. 10 is a plan view schematically illustrating a positional relationship between a support plate and a gas supply nozzle.
Figure 11:
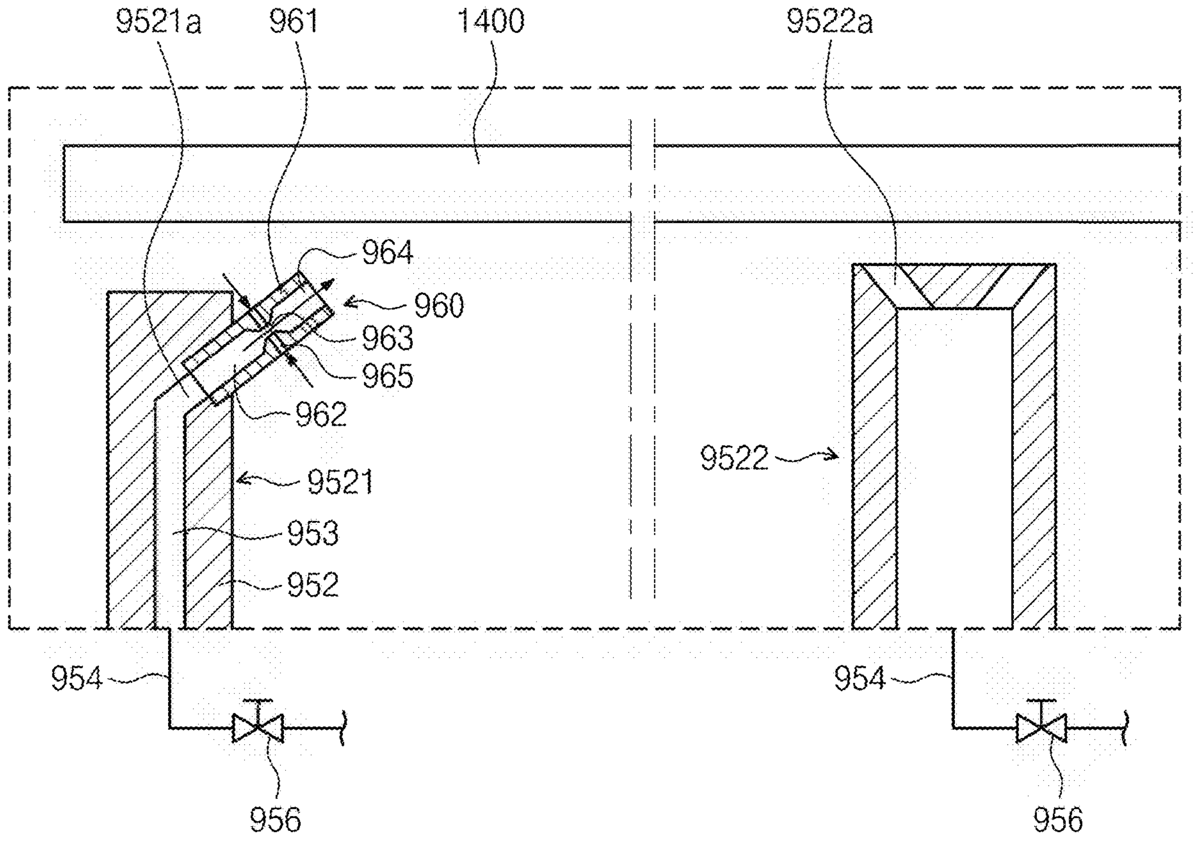
FIG. 11 is a side cross-sectional view of the gas supply nozzle.

FIG. 10 is a plan view schematically illustrating a positional relationship between a support plate and a gas supply nozzle, and FIG. 11 is a side cross-sectional view of the gas supply nozzle.

Referring to FIG. 10 to FIG. 11, and FIG. 9 which was previously illustrated, the cooling unit 950 may be provided within the support plate 1320 and may include a gas supply nozzle 952, a gas supply line 954, and a valve 956.

The gas supply nozzle 952 supplies a cooling gas toward the heater member 1400 to cool the heater member 1400. The gas supply nozzle 952 may be configured to supply the cooling gas to a bottom surface of the heater member 1400. The gas supply nozzle 952 may be configured to discharge the cooling gas from a position lower than the heater member 1400 toward the bottom surface of the heater member 1400 in an upwardly inclined direction.

A plurality of gas supply nozzles 952 may be provided. A portion of the plurality of gas supply nozzles 952, which are defined as first gas supply nozzles 9521, are positioned under an edge of the heater member 1400 and may be provided to supply the cooling gas toward a center of the bottom surface of the heater member 1400. The first gas supply nozzle 9521 may be disposed at regular intervals along a circumferential direction of the heater member 1400.

In addition, a portion of the plurality of gas supply nozzles 952, which are defined as second gas supply nozzles 9522, are positioned under a center of the heater member 1400 and may be provided to supply the cooling gas toward an edge of the bottom surface of the heater member 1400. At least two discharge parts 9522*a* for discharging the cooling gas may be provided along a top circumference of the second gas supply nozzle 9522. The second gas supply nozzle 9522 cools a central part of the heater member 1400, which may not be easily cooled by the first gas supply nozzle 9521.

In some embodiments, the first gas supply nozzle 9521 may be provided to discharge a relatively larger amount of the cooling gas than the second gas supply nozzle 9522 in a process of cooling the heater member 1400.

In some embodiments, at least one temperature sensor 970 for measuring a temperature of the heater member 1400 may be provided within the support plate 1320. The temperature sensor 970 may be positioned in a region at which the cooling gas supplied from the gas supply nozzle 952 does not directly reach. In particular, the temperature sensor 970 may be positioned in a region at which the cooling gas supplied from the first gas supply nozzle 9521 does not directly reach. In this case, the temperature sensor 970 is affected by the cooling gas, and a problem of not being able to accurately measure the temperature of the heater member 1400 is solved.

The gas supply line 954 supplies the cooling gas to the gas supply nozzle 952.

The valve 956 is provided in the gas supply line 954 to adjust a supply amount of the cooling gas.

A flow rate amplifier 960 may be provided to the discharge portion 9521*a* of the first gas supply nozzle 9521. The flow rate amplifier 960 amplifies a flow rate of the cooling gas discharged from the first gas supply nozzle 9521.

The flow rate amplifier 960 includes a cap 961. The cap 961 may be provided attachable/detachable to the discharge portion 9521*a*. A first fluid channel 962, an orifice fluid channel 963, and a second fluid channel 964 are continuously formed within the cap 961 along a same axis. The orifice fluid channel 953 has a smaller diameter than the first fluid channel 962 and the second fluid channel 964. In other words, the cooling gas supplied from an inner fluid channel of the first gas supply nozzle 9521 passes through the first fluid channel 962, the orifice fluid channel 963, and the second fluid channel 964 sequentially, and gains speed at the orifice fluid channel 963. An airflow inlet hole 965 communicating with the orifice fluid channel 963 may be formed outside the cap 961. According to Bernoulli's principle, when the cooling gas passes through the orifice fluid channel 963, an inner pressure is lowered, and an outer airflow flows through the airflow inlet hole 965, amplifying the flow rate of the gas moving through the second fluid channel 964.

The first gas supply nozzle 9521 provided with the flow rate amplifier 960 effectively cools the heater member 1400.

In some embodiments, the flow rate amplifier 960 may also be provided to the second gas supply nozzle 9522.

The substrate treating apparatus 1 may further include a controller (not shown). The controller adjusts the flow rate of the cooling gas discharged from the gas supply nozzle 952 based on a measured value of the temperature sensor 970 so that the heater member 1400 reaches a predetermined temperature.

Figure 12:
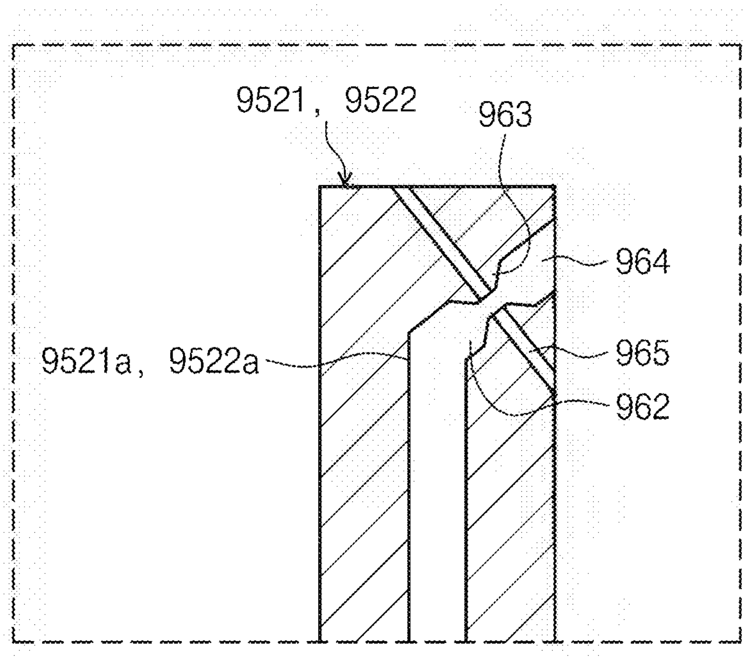
FIG. 12 is a modified examples of the gas supply nozzle.

FIG. 12 is a modified examples of the gas supply nozzle.

Referring to FIG. 12, in some embodiments, a first fluid channel 962', an orifice fluid channel 963', and a second fluid channel 964' may be continuously formed in the discharge parts 9521*a* and 9522*a* of the gas supply nozzles 9521, 9522. The orifice fluid channel 953 has a smaller diameter than the first fluid channel 962 and the second fluid channel 964. In addition, the gas supply nozzles 9521 and 9522 may further be provided with an airflow inlet hole 965 communicating with the orifice fluid channel 963.

Referring back to FIG. 2 and FIG. 3, a plurality of buffer chambers 3800 are provided. A portion of the buffer chambers 3800 are disposed between the index module 20 and the transfer chamber 3400. Hereinafter, these buffer chambers are referred to as front buffers 3802. A plurality of front buffers 3802 are provided, and are positioned to be stacked on each other in the vertical direction. Another portion of the buffer chambers 3802 and 3804 is disposed between the transfer chamber 3400 and the interface module 40. Hereinafter these buffer chambers are referred to as rear buffers 3804. A plurality of rear buffers 3804 are provided, and are positioned to be stacked on each other in the vertical direction. Each of the front buffers 3802 and the rear buffers 3804 temporarily store a plurality of substrates W. The substrate W stored in the front buffer 3802 is taken in or taken out by the index robot 2200 and the transfer robot 3422. The substrate W stored in the rear buffer 3804 is taken in or taken out by the transfer robot 3422 and the first robot 4602.

The developing block 30*b* has a heat treating chamber 3200, a transfer chamber 3400, and a liquid treating chamber 3600. The heat treating chamber 3200, the transfer chamber 3400, and the liquid treating chamber 3600 of the developing block 30*b* are provided in a structure and arrangement generally similar to the heat treating chamber 3200, the transfer chamber 3400, and the liquid treating chamber 3600 of the coating block 30*a*. However, in the developing block 30*b*, all of the liquid treating chambers 3600 are provided to be a developing chamber 3600 which develops the substrate by supplying a developing liquid.

The interface module 40 connects the treating module 30 with an outer exposing apparatus 50. The interface module 40 has an interface frame 4100, an additional process chamber 4200, an interface buffer 4400, and a transfer member 4600.

A fan filter unit for forming a downward air flow therein may be provided at a top end of the interface frame 4100. The additional process chamber 4200, the interface buffer 4400, and the transfer member 4600 are positioned within the interface frame 4100. The additional process chamber 4200 can perform a certain additional process before the substrate W on which a process has been completed is taken into the exposing apparatus from the coating block 30*a*. Selectively, the additional process chamber 4200 can perform a certain additional process before a substrate W on which a process is completed in the exposing apparatus is taken into the developing block 30*b*. In some embodiments, the additional process may be an edge exposing process which exposes the edge region of the substrate W, a top surface cleaning process which cleans the top surface of the substrate W, or a bottom surface cleaning process which cleans the bottom surface of the substrate W. A plurality of additional process chambers 4200 may be provided, and they may be provided to be stacked on each other. All of the additional process chambers 4200 may be provided to perform the same process. Selectively, a portion of the additional process chambers 4200 may be provided to perform different processes.

The interface buffer 4400 provides a space at which a substrate W transferred between the coating block 30*a*, the additional process chamber 4200, the exposing apparatus, and the developing block 30*b* temporarily stays during the transfer process. A plurality of interface buffers 4400 may be provided, and the plurality of interface buffers 4400 may be provided to be stacked on each other.

In some embodiments, with respect to an extension of a lengthwise direction of the transfer chamber 3400, the additional process chamber 4200 may be positioned at a side, and the interface buffer 4400 may be positioned on the other side.

The transfer member 4600 transfers the substrate W between the coating block 30*a*, the additional process chamber 4200, the exposing apparatus, and the developing block 30*b*. The transfer member 4600 may be provided as one or a plurality of robots. In some embodiments, the transfer member 4600 has a first robot 4602 and a second robot 4606. The first robot 4602 can transfer the substrate W between the coating block 30*a*, the additional process chamber 4200, and the interface buffer 4400, the interface robot 4606 can transfer the substrate W between the interface buffer 4400 and the exposing apparatus, and the second robot 4604 can transfer the substrate W between the interface buffer 4400 and the developing block 30*b*.

Each of the first robot 4602 and the second robot 4606 includes a hand on which the substrate W is placed, and the hand may be provided to be forwardly and backwardly movable, rotatable based on an axis parallel to the third direction 16, and movable along the third direction 16.

The hand of the index robot 2200, the first robot 4602, and the second robot 4606 may all be provided in the same shape as the hand 3420 of the transfer robot 3422 and 3424. Selectively, a robot hand which directly exchanges the substrate W with the transfer plate 3240 of the heat treating chamber is provided in the same shape as the hand 3420 of the transfer robot 3422, 3424, and another robot hand can be provided in a different shape.

In some embodiments, the index robot 2200 is provided to directly exchange the substrate W with the heating apparatus 3230 of the front heat treating chamber 3200 provided in the coating block 30*a*.

In addition, the transfer robot 3422 provided in the coating block 30*a* and the developing block 30*b* can be provided to directly exchange the substrate W with the transfer plate 3240 positioned in the heat treating chamber 3200.

The treating block of the substrate treating apparatus 1 described above has been described as performing a coating treatment process and a developing treatment process. However, unlike this, the substrate treating apparatus 1 may have only the index module 20 and the treating block 37 without the interface module. In this case, the treating block 37 performs only the coating treatment process, and a film coated on the substrate W may be a spin-on hard mask film (SOH).

The effects of the inventive concept are not limited to the above-mentioned effects, and the unmentioned effects can be clearly understood by those skilled in the art to which the inventive concept pertains from the specification and the accompanying drawings.

Although the preferred embodiment of the inventive concept has been illustrated and described until now, the inventive concept is not limited to the above-described specific embodiment, and it is noted that an ordinary person in the art, to which the inventive concept pertains, may be variously carry out the inventive concept without departing from the essence of the inventive concept claimed in the claims and the modifications should not be construed separately from the technical spirit or prospect of the inventive concept.

What is claimed is:

1. A substrate treating apparatus comprising:

a housing defining a treating space therein; and a support unit configured to support a substrate at the treating space, and wherein the support unit includes:

a support plate configured to support the substrate;

a heater member at the support plate and configured to heat the substrate; and a cooling unit configured to cool the heater member, and wherein the cooling unit includes:

a gas supply nozzle configured to supply a cooling gas to the heater member, and wherein a flow rate amplifier defines an orifice fluid channel at a discharge of the gas supply nozzle.

2. The substrate treating apparatus of claim 1, wherein the flow rate amplifier has a first fluid channel, the orifice fluid channel, and a second fluid channel which are continuously formed therein, and a cap having an airflow inlet hole which communicates with the orifice fluid channel at an outside, and the orifice fluid channel has a diameter smaller than a diameter of the first fluid channel and the second fluid channel.

3. The substrate treating apparatus of claim 1, wherein the flow rate amplifier is selectively attachable and detachable to the gas supply nozzle.

4. The substrate treating apparatus of claim 1, wherein the gas supply nozzle is configured to supply the cooling gas to a bottom surface of the heater member.

5. The substrate treating apparatus of claim 1, further comprising:

a controller configured to control the cooling unit, and wherein the controller is configured to adjust a flow rate of a cooling gas discharged from the gas supply nozzle so the heater member reaches a first temperature.

6. A substrate treating apparatus comprising:

a housing defining a treating space therein; and a support unit configured to support a substrate at the treating space, and wherein the support unit includes:

a support plate configured to support the substrate;

a heater member at the support plate and configured to heat the substrate; and a cooling unit configured to cool the heater member, and wherein the cooling unit includes:

a gas supply nozzle configured to supply a cooling gas to the heater member, and wherein a first fluid channel, an orifice fluid channel, and a second fluid channel are continuously provided at a discharge of the gas supply nozzle, while the orifice fluid channel has a diameter smaller than a diameter of the first fluid channel and the second fluid channel.

7. The substrate treating apparatus of claim 6, wherein an airflow inlet hole which communicates with the orifice fluid channel is at the gas supply nozzle.

8. The substrate treating apparatus of claim 7, wherein a cap is selectively attachable and detachable at the discharge, and the first fluid channel, the orifice fluid channel, the second fluid channel, and the airflow inlet hole is formed on the cap.

9. The substrate treating apparatus of claim 6, wherein the gas supply nozzle is configured to supply the cooling gas to a bottom surface of the heater member.

10. The substrate treating apparatus of claim 6 further comprising:

a controller configured to control the cooling unit, and wherein the controller is configured to adjust a flow rate of a cooling gas discharged from the gas supply nozzle so the heater member reaches a first temperature.

11. The substrate treating apparatus of claim 6, wherein a temperature sensor configured to measure a temperature of the heater member at the support plate, and the temperature sensor is positioned at a region in which a cooling gas supplied from the gas supply nozzle does not directly reach.

12. A substrate treating apparatus comprising:

a housing defining a treating space therein; and a support unit configured to support a substrate at the treating space, and wherein the support unit includes:

a support plate configured to support the substrate;

a heater member at the support plate and configured to heat the substrate; and a cooling unit configured to cool the heater member, and wherein the cooling unit includes:

a first gas supply nozzle under an edge of the heater member and configured to supply a cooling gas to a center direction of a bottom surface of the heater member;

a second gas supply nozzle under a center of the heater member and configured to supply the cooling gas in an edge direction of the bottom surface of the heater member, and wherein a flow rate amplifier defines an orifice fluid channel at a discharge of the first gas supply nozzle.

13. The substrate treating apparatus of claim 12, wherein the flow rate amplifier includes a first fluid channel, an orifice fluid channel, and a second fluid channel continuously formed therein, and a cap having an airflow inlet hole which communicates with the orifice fluid channel formed at an outside, and the orifice fluid channel has a diameter smaller than a diameter of the first fluid channel and the second fluid channel.

14. The substrate treating apparatus of claim 12, wherein the support plate further includes a temperature sensor configured to measure a temperature of the heater member, and the temperature sensor is positioned at a region in which a cooling gas supplied from the first gas supply nozzle does not directly reach.

15. The substrate treating apparatus of claim 12, further comprising:

a controller configured to control the cooling unit, and wherein the controller is configured to adjust a flow rate of a cooling gas discharged from the first gas supply nozzle and the second gas supply nozzle so the heater member reaches a first temperature.

16. The substrate treating apparatus of claim 12, wherein the first gas supply nozzle is configured to supply the cooling gas in an amount larger than the second gas supply nozzle in a process of cooling the heater member.

17. The substrate treating apparatus of claim 12, wherein the first gas supply nozzle is configured to discharge the cooling gas from a position lower than the heater member toward the bottom surface of the heater member in an upwardly inclined direction.

18. The substrate treating apparatus of claim 12, wherein the second gas supply nozzle is configured to discharge the cooling gas from a position lower than the heater member toward the bottom surface of the heater member in an upwardly inclined direction.

19. The substrate treating apparatus of claim 12, wherein at least two discharges are provided at the second gas supply nozzle.

20. The substrate treating apparatus of claim 12, wherein the first gas supply nozzle is provided in a plurality, and is positioned along a circumferential direction of the heater member.

* * * * *